US009208999B2

(12) United States Patent
Krassnitzer

(10) Patent No.: US 9,208,999 B2
(45) Date of Patent: Dec. 8, 2015

(54) COIL SECTION ASSEMBLY FOR SIMULATING CIRCULAR COILS FOR VACUUM DEVICES

(75) Inventor: Siegfried Krassnitzer, Feldkirch (AT)

(73) Assignee: OERLIKON SURFACE SOLULTIONS AG, TRUBBACH, Trubbach (CH)

( * ) Notice: Subject to any disclaimer, the term of this patent is extended or adjusted under 35 U.S.C. 154(b) by 599 days.

(21) Appl. No.: 13/510,733

(22) PCT Filed: Oct. 5, 2010

(86) PCT No.: PCT/EP2010/006067
§ 371 (c)(1),
(2), (4) Date: Jul. 19, 2012

(87) PCT Pub. No.: WO2011/060847
PCT Pub. Date: May 26, 2011

(65) Prior Publication Data
US 2012/0279450 A1 Nov. 8, 2012

Related U.S. Application Data

(60) Provisional application No. 61/262,965, filed on Nov. 20, 2009.

(51) Int. Cl.
| C23C 16/00 | (2006.01) |
| C23F 1/00 | (2006.01) |
| H01L 21/306 | (2006.01) |
| H01J 37/32 | (2006.01) |
| H01L 21/67 | (2006.01) |

(52) U.S. Cl.
CPC ..... *H01J 37/32431* (2013.01); *H01L 21/67201* (2013.01)

(58) Field of Classification Search
USPC .......... 118/723 I, 723 IR, 723 MR, 723 MA; 156/345.42, 345.46, 345.48, 345.49; 315/111.41, 111.51
See application file for complete search history.

(56) References Cited

U.S. PATENT DOCUMENTS

| 5,250,779 A | 10/1993 | Kaufmann et al. |
| 6,013,905 A * | 1/2000 | Oster ............................ 219/651 |
| 6,164,241 A * | 12/2000 | Chen et al. ................... 118/723 I |

(Continued)

FOREIGN PATENT DOCUMENTS

| WO | 95/15672 A1 | 6/1995 |
| WO | 97/02588 A1 | 6/1996 |

OTHER PUBLICATIONS

International Search Report for PCT/EP2010/006067 dated Dec. 3, 2010.

*Primary Examiner* — Rakesh Dhingra
(74) *Attorney, Agent, or Firm* — Pearne & Gordon LLP

(57) ABSTRACT

The invention relates to a vacuum treatment chamber, comprising a coil arrangement for generating a magnetic field in the chamber, wherein the coil arrangement comprises at least one first coil section and a second coil section, wherein the first coil section and the second coil section are arranged adjacent to each other in cross-section and preferably in one plane, such that at least a partial section of the first coil substantially follows the course of a partial section of the second coil, wherein the spacing of the first partial section from the second partial section is at least one order of magnitude smaller than the cross-section of the optionally smaller coil section.

6 Claims, 4 Drawing Sheets

(56) References Cited

U.S. PATENT DOCUMENTS

2001/0022158 A1* 9/2001 Brcka ..................... 118/723 I
2004/0182516 A1* 9/2004 Lindley et al. ........... 156/345.46
2004/0219294 A1* 11/2004 Massler et al. ............. 427/249.1
2006/0102077 A1 5/2006 Esselbach et al.

* cited by examiner

COIL SECTION ASSEMBLY FOR SIMULATING CIRCULAR COILS FOR VACUUM DEVICES

BACKGROUND

1. Field

The present invention relates to a magnetic system for vacuum facility according to the preamble of claim 1. The invention relates in particular to coating facilities with a magnetic system for controlling plasma properties.

2. Description of Related Art

To control the plasma properties in coating facilities, magnetic systems are used among others to generate magnetic fields. The magnetic field lines and magnetizing forces are to be distributed in the coating chamber respectively on the substrate as homogeneously and effectively as possible. An important method for generating magnetic fields is the mounting of coils, especially in a Helmholtz configuration. A practical fitting of coils, e.g. in a Helmholtz configuration, is very difficult to achieve especially in large batch facilities with frontloading, as they would protrude when the doors are opened and stand in the way during loading and unloading.

One way of overcoming this difficulty is to switch from frontloading to bottom and/or top loading. Accordingly, a coating facility and in particular a heating process by means of a plasma are disclosed in U.S. Pat. No. 5,250,779 in the name of Kaufmann et al., wherein the substrates are connected as the anode of the plasma source. The plasma and thus the distribution of the heating output are controlled through a couple of Helmholtz coils. In this process, the loading of the chamber with substrates is carried out as per the concept 'bottom loader', i.e. parallel to the coil axes and through the lower coil. As a result, there is no collision with the Helmholtz coils. So-called top loaders, which are loaded from above, can be put into effect in a similar manner.

If the concept of the front loader, however, is to be retained, the aforementioned difficulties will have to be confronted, as are further illustrated in FIG. 1. It shows a perspective view (FIG. 1a) as well as a top view (FIG. 1b) of a coating facility 1 with an open front door 3. It is therefore a front loader. The Helmholtz coils 5, 7 should have nearly the diameter of the coating chamber 9 in order to provide the required homogeneous field in the chamber. The coil 5 is then placed above the actual chamber and the coil 7 is mounted below the chamber. As can be clearly seen in FIG. 1, the coil 7 presents a considerable obstacle for loading and unloading, as it is not possible to approach the frame of the chamber.

A possible solution to the problem is also indicated in FIG. 1, as described in US200601020077 in the name of Esselbach et al. A very small lower coil 11 relative to the ideal Helmholtz configuration is hereby suggested. The coil therefore no longer disrupts the loading process; the achievable distribution of the magnetic field within the chamber is however far from its optimum.

In another attempt at a solution, as a lower coil, a coil is proposed whose windings at certain points are designed as movable strands. This makes it possible for example to fold down a segment of the coil during the loading process. The manufacturing and especially the maintenance of such coils, however, involve substantial efforts and expense. It must notably be ensured that a strong electricity current can flow without any major hindrance through the movable parts. Furthermore, space must also be provided in the loading and unloading area for the part that is to be folded down, so that it is necessary to consider that the coils used for this purpose have a considerable thickness.

SUMMARY

There is hence a need for a vacuum treatment facility that is designed as a front loader with a coil arrangement capable of overcoming the problems of the prior art.

It is thus an aim of the present invention to propose a vacuum treatment facility designed as a front loader and with a coil arrangement that constitutes an improvement over the prior art.

According to the invention, the aim is achieved in that at least one of the coils of a Helmholtz coil pair is formed of two adjacent coil sections. The at least one coil thus comprises at least a first coil section and a second coil section, wherein the first and second coil sections are arranged adjacent to each other in cross-section and preferably in one plane. In this context, the term 'adjacent' is to be understood in such a way that at least one respective partial section each of the first coil essentially follows the contour of one partial section of the second coil, wherein the distance between the first partial section and the second partial section is at least one dimension smaller than the cross-section of the possibly smaller coil section. The smaller coil section refers to the coil section that possibly has a smaller cross-section. Such a configuration of the lower coil leads to the possibility of having a current run through the first and second coil section in such way that the current flows in opposite directions in the adjacent partial sections and thus cancel each other out as regards the generated magnetic field of the whole coil.

DETAILED DESCRIPTION

Figure 1A:
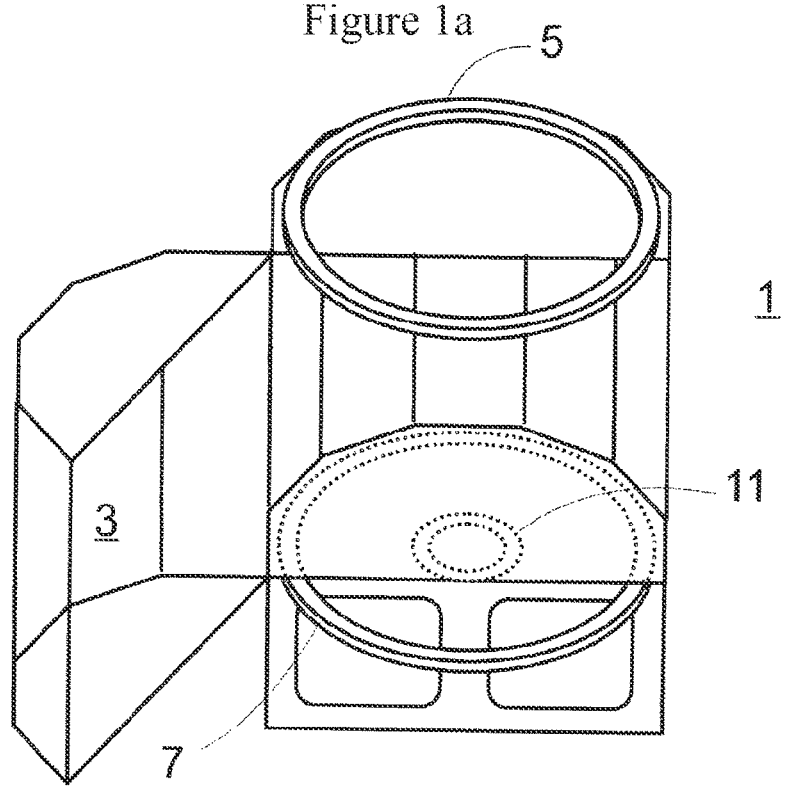
FIG. 1a is a perspective view illustrating an example of a front loader.
Figure 1B:
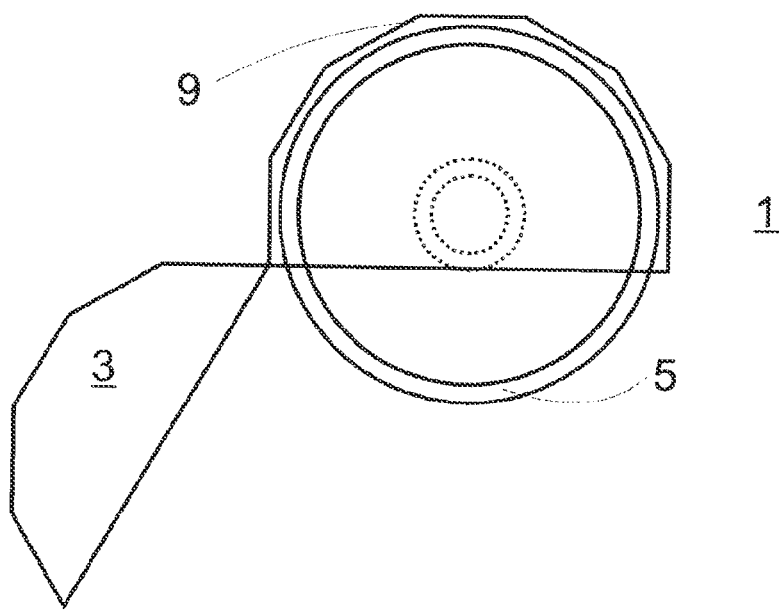
FIG. 1b is a top view illustrating an example of a front loader.
Figure 2A:
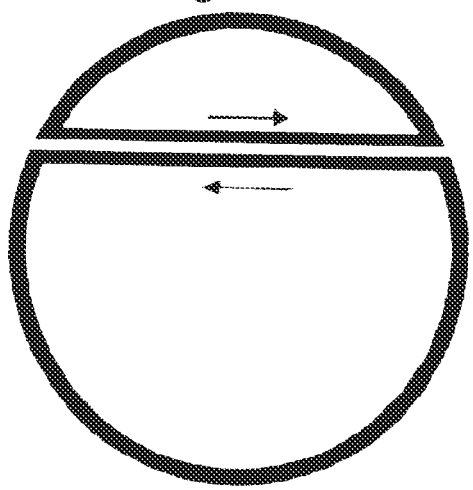
FIG. 2a is a view illustrating an example of a coil arrangement.
Figure 2B:
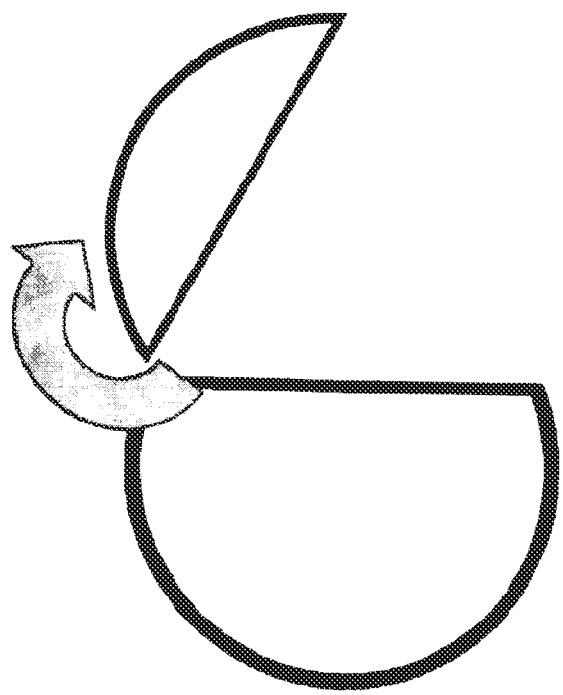
FIG. 2b is a view illustrating another example of a coil arrangement.

FIG. 2a illustrates schematically such a coil configuration, composed of a first and second coil section. The arrows indicate the direction of the electricity flow during operation. This yields as a result essentially the magnetic field of a circular coil. The particular advantage of this configuration is that the first coil section is electrically decoupled from the second coil section, i.e. it does not form a common electric circuit with it and it can therefore be mounted easily in a mechanically moveable manner relative to the second coil section. FIG. 2b shows an embodiment according to which the first coil section has been tilted away around an axis parallel to the axis of the Helmholtz coil pair. This axis is often parallel to the axis of the front door, so that the first coil section could for example be mounted under and tilted away together with it.

Electric coils can generally be produced by winding an electrically conductive wire onto a winding reel. Copper with a dipping-varnish insulation is generally used as wire material. Disadvantages are the high weight and the significant cost for the copper wire and winding reel. When using less expensive round wire, the packing density of the wire, usually less than 60%, is low. The result is poor heat dissipation, which together with the use of insulating varnishes means a limitation of the coil's magnetic power.

The manufacturing of coils by winding aluminum strips has proven to be an alternative. In this case, anodized aluminum strips are wound into a coil. The aluminum oxide layer ensures the insulation. Such coils are molded with epoxy resin so that they constitute an inherently stable mechanical construction. This allows packing densities of the conducting material of up to 98% to be achieved. Another favorable effect is the low mass of such aluminum strip coils, which together with their good mechanical stability enables them to be mounted in a simple manner.

The invention is now explained in detail and more precisely on the basis of several embodiments and with the help of the figures.

Figure 3:
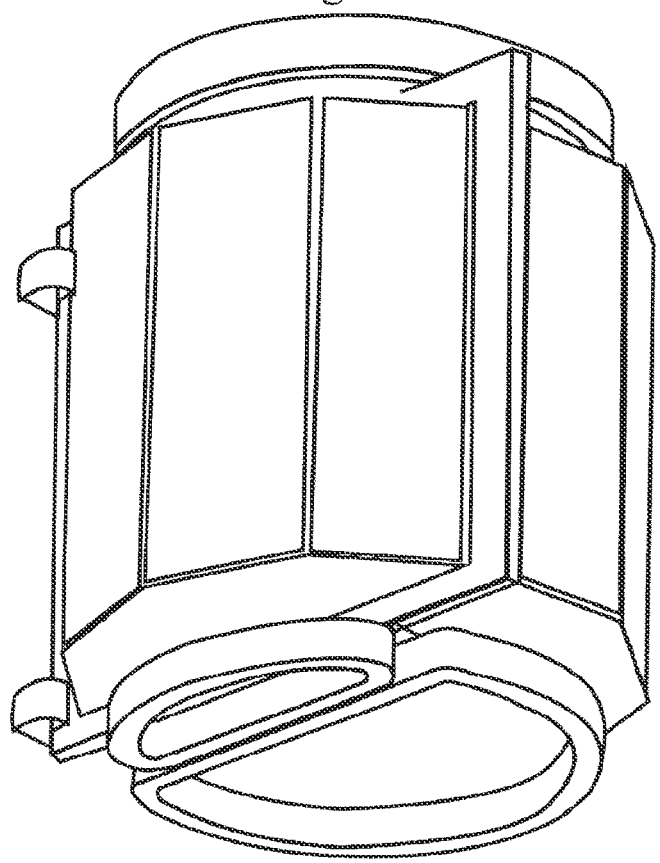
FIG. 3 is a perspective view illustrating an example of a frame of a single-door vacuum treatment facility having a coil arrangement.

FIG. 3 shows in perspective the frame of a single-door vacuum treatment facility with a first embodiment of an inventive coil configuration. The first coil section, which is mounted on the bottom of the door, is clearly visible in the lower part, as is the second coil section, which is mounted below the rest of the facility.

Figure 4A:
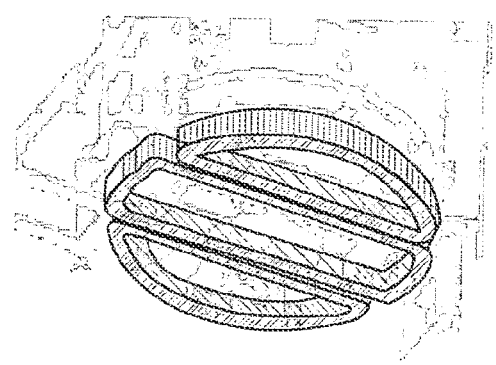
FIG. 4a is a perspective side view illustrating an example of a coil section configuration in a coating facility.
Figure 4B:
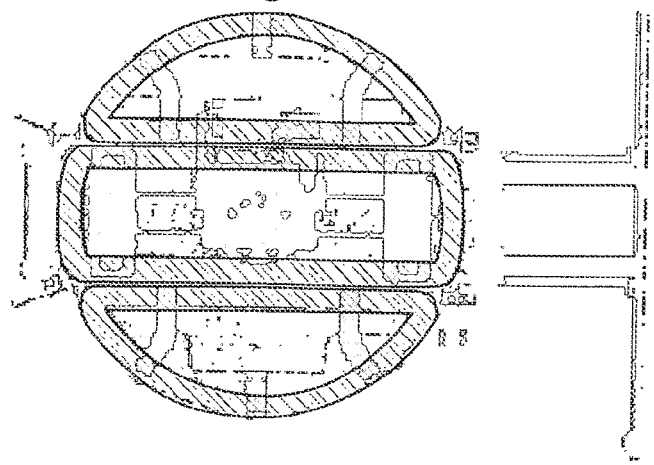
FIG. 4b is a top view from below illustrating an example of a coil section configuration in a coating facility.
Figure 5A:
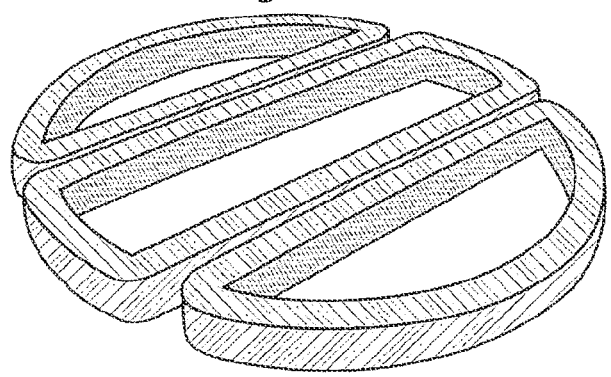
FIG. 5a is a view illustrating an example of three individual coil sections with a closed chamber.
Figure 5B:
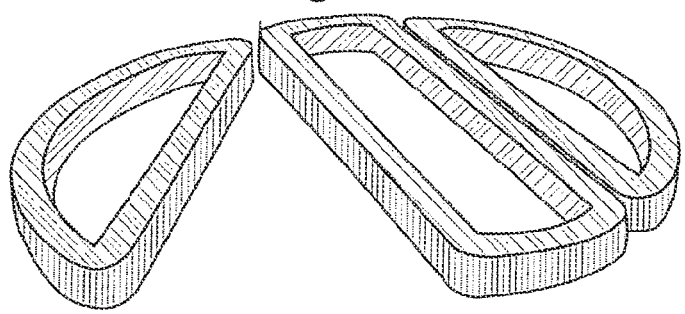
FIG. 5b is a view illustrating an example for three individual coil sections with an open chamber.

FIGS. 4a and 4b show an embodiment illustrating parts of a coating facility known under the name of Oerlikon Balzers RS 90 and that has been modified according to the invention. This facility has two doors: one for substrate loading and the other for machine maintenance. In this embodiment, a circular coil corresponding to a large extent to the circumference of the chamber is simulated by three individual coils, whose combined circumference yields a circle. FIG. 4a shows the coil section configuration of the facility in a perspective side view. FIG. 4b shows the coil section configuration of the facility in a top view from below. FIGS. 5a and 5b display the three individual coil sections. The electrical as well as the mechanical isolation of the individual coils is clearly visible. FIG. 5a simulates the situation with a closed chamber, FIG. 5b simulates the situation with an open chamber.

The vacuum treatment chamber with coil arrangement for generating a magnetic field within the chamber has been described, wherein the coil arrangement comprises at least one first coil section and a second coil section, wherein the first coil section and the second coil section are arranged adjacent to each other in cross-section and preferably in one plane, such that at least one respective partial section each of the first coil essentially follows the contour of one partial section of the second coil, wherein the distance between the first partial section and the second partial section is at least one dimension smaller than the cross-section of the possibly smaller coil section.

The coil arrangement can comprise a further coil and the coil arrangement may constitute a Helmholtz coil arrangement corresponding essentially to the diameter of the chamber.

The first coil section does not have to form a common electric circuit with the second coil section and is preferably electrically decoupled.

The first coil section can be mounted on the treatment facility in a manner mechanically decoupled from the second coil section.

This vacuum treatment chamber may be a model with a front door and the first coil section can be mounted on the front door itself and be tilted together with it away from the chamber.

The vacuum treatment chamber can be an integral component of a vacuum treatment facility and especially of a coating unit.

What is claimed is:

1. A vacuum treatment chamber, comprising:
    a coil arrangement for generating a magnetic field within the chamber, the coil arrangement comprising at least one lower coil configured as a multi-section coil, the multi-section coil comprising at least one first coil section and a second coil section, the first coil section and the second coil section being arranged adjacent to each other in cross-section and in one plane, at least one segment of the first coil section essentially following a contour of one segment of the second coil section,
    a distance between the segment of the first coil section and the segment of the second coil section being smaller than a cross-section of a smaller one of the first coil section and the second coil section; and
    a front door, the first coil section being mounted on the bottom of the front door and configured to tilt together with the front door away from the chamber.

2. The vacuum treatment chamber according to claim 1, wherein the coil arrangement further comprises another coil, and
    wherein the coil arrangement constitutes a Helmholtz coil arrangement corresponding essentially to a diameter of the chamber.

3. The vacuum treatment chamber according to claim 1, wherein the first coil section does not constitute a common electric circuit with the second coil section and is electrically decoupled.

4. The vacuum treatment chamber according to claim 1, wherein the first coil section is mounted such that the first coil section is mechanically decoupled from the second coil section.

5. A vacuum treatment facility, comprising:
    a coating facility comprising the vacuum treatment chamber according to claim 1.

6. A coating facility, comprising:
    the vacuum treatment chamber according to claim 1.

* * * * *